United States Patent [19]

Hayes

[11] Patent Number: 4,536,705

[45] Date of Patent: Aug. 20, 1985

[54] PROBE SEARCH TEST LIGHT AND CONTINUITY TESTER

[76] Inventor: John C. Hayes, 8316 Lages La., Baltimore, Md. 21206

[21] Appl. No.: 593,940

[22] Filed: Mar. 27, 1984

[51] Int. Cl.³ ............................................. G01R 31/00
[52] U.S. Cl. ..................................................... 324/53
[58] Field of Search ....................... 324/53, 51, 52, 133

[56] References Cited

U.S. PATENT DOCUMENTS

| | | | |
|---|---|---|---|
| 1,528,709 | 3/1925 | Trimble | 324/53 |
| 2,324,661 | 7/1943 | Woodington | 324/53 |
| 3,973,193 | 8/1976 | Hayes | 324/51 |

*Primary Examiner*—Stanley T. Krawczewicz

*Attorney, Agent, or Firm*—John F. McClellan, Sr.

[57] ABSTRACT

A portable, battery-powered combination probe search test light, test lead, and continuity tester provides a selection of modes of use for illuminated and non-illuminated search and continuity indication, in a simple circuit; according to needs indicated by push-button switches, continuity of a circuit to be tested may be indicated by illumination; in a further mode continuity is indicated by illumination of a dimmer light; these modes provide for testing the lights individually; two flexible leads with clips and a novel housing-mounted pivotal probe in selective combination provide contacts for the versatile modes of testing and for charging the battery either, with or without, illumination indicating charging.

9 Claims, 2 Drawing Figures

PROBE SEARCH TEST LIGHT AND CONTINUITY TESTER

FIELD OF THE INVENTION

This invention relates generally to electrical apparatus and specifically to battery powered test equipment.

SUMMARY OF THE INVENTION

In the field of this invention the following U.S. patent Nos. are known:

3,973,193 to John C. Hayes, the present inventor, issued 8-3-76, disclosed a hand-held combination tester and trouble light, with clip-equipped test leads;

4,250,446 to R. Ponte, issued 2-10-81, disclosed a flashlight/portable circuit tester;

4,105,968 to R. L. Mobley et al, 8-8-78, disclosed an electrical tester that is portable and has a probe that can be retracted, by sliding;

3,919,631 to R. D. Brown, 11-11-75, disclosed a representative portable battery powered type continuity tester with a probe tip and light;

However, none of the referenced devices can provide the combination of advantages of the present invention which are, according to principal objects;

to provide probe search light and continuity tester system which can, at the option of the user, variously and conveniently indicate continuity in a circuit tested.

Additional objects are to provide a system as described which can be used in circuit with a charging source to charge the system battery, with illumination of a light indicating that charging is taking place, or without the illumination, as selected.

Yet further objects are to provide a system as described which has a novel probe mechanism that quickly extends to a positively held position, can be extended at right angles to the length of the instrument housing, can be used as a terminal when retracted as well as when extended, and is substantially foolproof.

Still further objects are to provide a system that is simple and reliable, economical, durable, lightweight, compact, easy to use and convenient to use.

BRIEF DESCRIPTION OF THE DRAWINGS

The above and other objects and advantages of this invention will become more readily apparent on examination of the following description, including the drawings in which like reference numerals refer to like parts.

DETAILED DESCRIPTION

Figure 1:
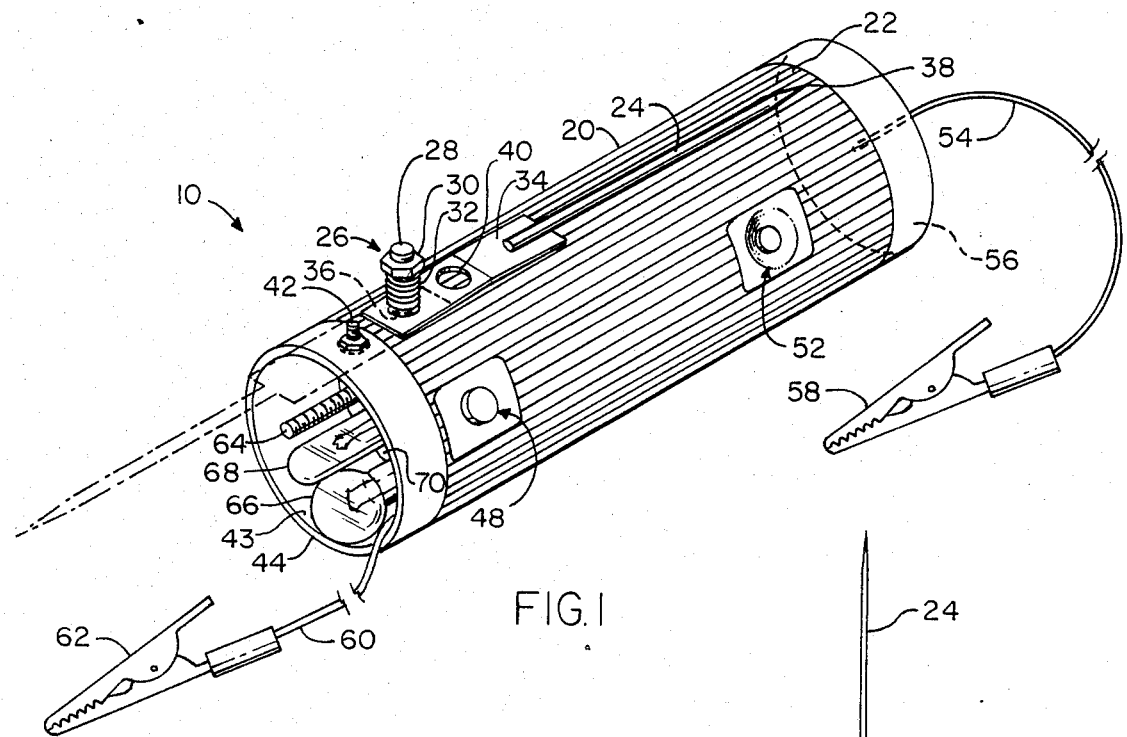
FIG. 1 is a side perspective view.

FIG. 1 shows the invention in preferred embodiment 10 as seen by a user.

Housing 20 may be cylindrical plastic, preferably with longitudinal ribs 22 along it. These ribs serve as non-slip grip and also to retain the probe 24 in folded position. The probe assembly 26 comprises a threaded radially extending terminal 28 with a nut 30 adjustable compressing a coaxial compression spring 32 against the perforate butt end 34 of the probe, a first hole 36 of which is on the terminal 28 under the spring 32. In side view the probe 24 may have an arcuate shape, concave inwardly, so that the point 38 safely lies between ribs 22 when folded as shown. The butt end 34 is manually lifted against the resilient urging of the spring to shift probe position. The probe may point in any direction, if desired.

In extended position (broken lines) second hole 40 through the probe butt extends over and engages post 42 which is affixed to the housing between the terminal 28 and the open front 44 of the housing. This positive-positioning engagement of the probe is held by spring 32, which must be compressed to deploy and to retract the probe.

Flexible lead 54 emerges from the closed rear end of the housing and has an alligator-type clip 58 on the end for convenience. The closed rear end is removable.

Similarly, flexible lead 60 emerges from the open front end of the housing and has also preferably an alligator clip 62 on it. Threaded post 64 is a second terminal, connected to flexible lead 60 in the circuit. Also visible in the open front of the housing are a first light bulb or lamp 66 which may be a six volt bulb, and a second light bulb 68 which may be a twelve volt bulb.

Bulkhead 70 recessed in the open front end or recess 43 of the housing supports the sockets of the lamps or light bulbs, and the second terminal. The recess 43 in the open front end 44 is large enough to store the lead 60 and clip 62 as well as shield the lamps.

Figure 2:
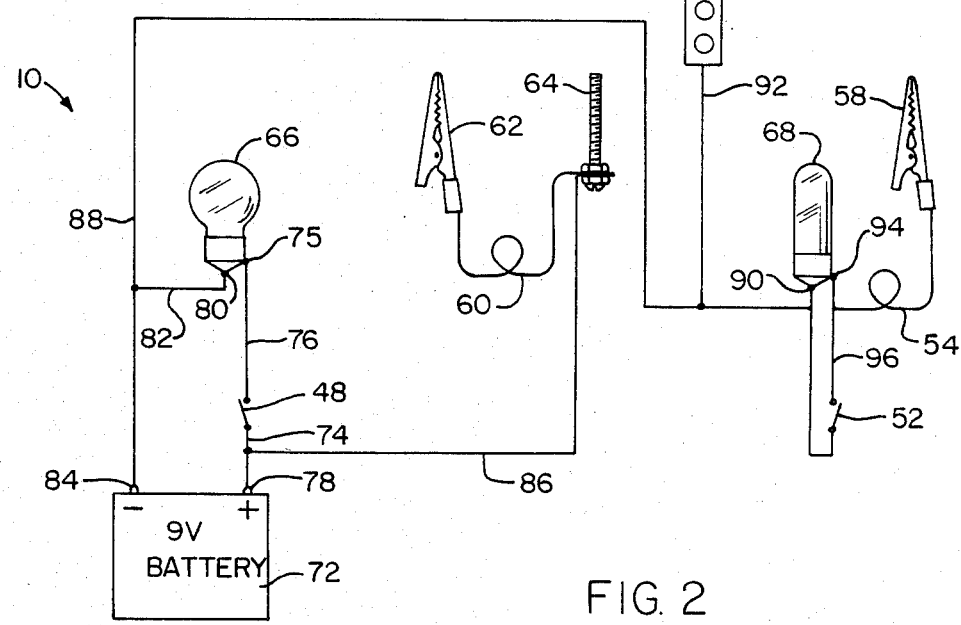
FIG. 2 is a circuit diagram.

FIG. 2 diagrams the circuitry.

Battery 72, which may preferably be a nine-volt battery, powers the system.

Leads 74, 76 extend from the first or positive electrode through pushbutton switch 48 (this is the first means for switching) to first terminal 75 of lamp 66, and lead 82 completes the circuit from the lamp to the battery negative electrode 84. Lead 86 connects the battery positive electrode 78 with housing-affixed terminal 64 and from there with flexible lead 60 terminating in clip 62.

From the negative electrode 84 of the battery, lead 88 extends to second terminal 90 of the second lamp, twelve volt lamp 68, and also lead 92 extends from the same connection to probe assembly 26.

From the first terminal 94 of the lamp 68 a circuit includes a lead 96 that passes through the second means for switching, the push-button switch 52, to the second terminal 90 of the lamp. From the first terminal 94 flexible lead 54 extends to clip 58.

In operation, to test the first lamp 66, the user closes the normally open button switch 48. In this mode also the light can guide the user in dark locations such as under the instrument panel of a vehicle. When the user grounds 58 and the probe 26 finds a connection, the user releases 48 and if the connection is "hot" 68 will light up. To check a fuse in a circuit, the user connects 58 to ground then closes push-button switch 48 to see to touch first one side of the fuse and then the other side; both sides must light bulb 68, for the fuse to be good.

To test the second lamp 68, elements 62 and 58 may be touched together causing the second lamp 68 to light. Continuity of a circuit such as a 110-220 volt bulb, toaster, electric iron, water heater element, or the like may also be tested under these conditions by clipping 62 at one side and 58 at the other. If a test lead probe is wanted, the circuit from 58 to 26 with push-button switch 52 closed, will provide it.

To impress a charging voltage from a suitable source in parallel across electrodes 78 and 84, clipping 58, 62 across the source will charge battery 72; if switch 52 is open the charging mode will be indicated by lamp 68, with reduction in rate of charging; connection across 62 and 26 will charge the battery without illumination.

Threaded terminal 64 provides for clipping 58 or other connections to it in testing and for clipping 62 to it for storage of flexible line 60. A circular ⅛ inch (3 mm) transparent plastic cover with a tapped hole holding it to threaded terminal 64 can be swung over the end for protection or swung away for access.

The circuit 26 through 58 with 52 open provides for test circuit continuity testing with the fixed resistance of the lamp 68 in the circuit.

This invention is not to be construed as limited to the particular forms disclosed herein, since these are to be regarded as illustrative rather than restrictive. It is, therefore, to be understood that the invention may be practiced within the scope of the claims otherwise than as specifically described.

For example, the housing may be longitudinally divided to provide a separate chamber at the top for housing the wire 60 to isolate it from the batteries and other wires.

What is claimed and desired to be protected by United States Letters Patent is:

1. A system for continuity testing having: a housing, a battery with first and second electrodes in the housing, a first lamp with first and second terminals, first means for switching, means connecting the first lamp first terminal through the first means for switching to the battery first electrode, a second lamp with first and second terminals, a probe assembly, including a probe; means connecting the probe between the battery second electrode and the second lamp second terminal 90, a shunt circuit between said second lamp first and second termials, second means for switching, connected in series with said shunt circuit; first and second leads with respective contacts, the second lead connected with the first electrode, and the first lead connected with the first terminal of the second lamp.

2. A system as recited in claim 1, the battery supplying a nominal predetermined voltage, and the second lamp being of a type nominally rated for use with higher voltage than said predetermined voltage.

3. A system as recited in claim 2, the first lamp being of a type nominally rated for use with lower voltage than said predetermined voltage.

4. A system as recited in claim 3, the battery nominally supplying nine volt potential, the first lamp nominally rated for use with six volt potential, and the second lamp nominally rated for use with twelve volt potential.

5. A system as recited in claim 1, the housing being elongated and having a recessed front end, and said first and second lamps protectively mounted in said recessed front end.

6. A system as recited in claim 2, the housing having a ribbed contour, said probe having a point, said point being proportioned for entering a recess beween two of said ribs, for safety.

7. A system as recited in claim 5, said probe assembly including: a termnal extending from said housing, said probe having a butt end with a first hole engaging said extending terminal, a post forwardly adjacent to said extending terminal at a location for engaging a second hole in said butt, and a compression spring on the extending terminal for resiliently urging the probe against the housing.

8. A system as recited in claim 7, said extending terminal having threads, and a nut on the threads in position for bearing on the spring and adjusting said resilient urging.

9. A system as recited in claim 5, said first and second leads being flexible, and a fixed threaded member in said recessed front end and having connection wih said second flexible lead.

* * * * *